(12) United States Patent
Mishima et al.

(10) Patent No.: US 10,989,966 B2
(45) Date of Patent: Apr. 27, 2021

(54) TRANSPARENT SEMICONDUCTOR, LIGHT CONTROL BODY, AND ELECTRONIC DEVICE

(71) Applicant: TDK CORPORATION, Tokyo (JP)

(72) Inventors: Koji Mishima, Tokyo (JP); Yoshinori Sato, Tokyo (JP); Shouhei Harada, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 16/971,416

(22) PCT Filed: Feb. 21, 2019

(86) PCT No.: PCT/JP2019/006581
§ 371 (c)(1),
(2) Date: Aug. 20, 2020

(87) PCT Pub. No.: WO2019/163897
PCT Pub. Date: Aug. 29, 2019

(65) Prior Publication Data
US 2020/0400991 A1 Dec. 24, 2020

(30) Foreign Application Priority Data
Feb. 23, 2018 (JP) .............................. JP2018-031216

(51) Int. Cl.
| | | |
|---|---|---|
| H05B 33/28 | (2006.01) |
| H01L 51/50 | (2006.01) |
| C23C 14/08 | (2006.01) |
| H01B 5/14 | (2006.01) |
| G02F 1/1343 | (2006.01) |
| H01B 1/02 | (2006.01) |
| G02F 1/1334 | (2006.01) |

(52) U.S. Cl.
CPC ........ G02F 1/13439 (2013.01); G02F 1/1334 (2013.01); H01B 1/02 (2013.01); H01B 5/14 (2013.01)

(58) Field of Classification Search
CPC .......... G02F 1/1343; G02F 1/13; B32B 7/025
See application file for complete search history.

(56) References Cited

U.S. PATENT DOCUMENTS

| | | | |
|---|---|---|---|
| 10,510,457 B2 * | 12/2019 | Shingai | B32B 9/04 |
| 2015/0070630 A1 | 3/2015 | Kim et al. | |
| 2019/0160783 A1 * | 5/2019 | Shingai | H05B 33/12 |
| 2020/0292858 A1 * | 9/2020 | Shouhi | G02F 1/13 |

FOREIGN PATENT DOCUMENTS

| | | |
|---|---|---|
| JP | 2002-157929 A | 5/2002 |
| WO | 2013/141614 A1 | 9/2013 |

OTHER PUBLICATIONS

Aug. 27, 2020 International Preliminary Report on Patentability issued in International Patent Application No. PCT/JP2019/006581.

* cited by examiner

*Primary Examiner* — Tracie Y Green
(74) *Attorney, Agent, or Firm* — Oliff PLC (57) ABSTRACT

A transparent conductor including a transparent substrate, a first dielectric layer, a metal layer containing silver or a silver alloy as a primary component, a second dielectric layer composed of a semiconductor, and a third dielectric layer of which electrical conductivity is different from that of the second dielectric layer in the order presented, wherein the third dielectric layer-is composed of a conductor.

7 Claims, 6 Drawing Sheets

TRANSPARENT SEMICONDUCTOR, LIGHT CONTROL BODY, AND ELECTRONIC DEVICE

TECHNICAL FIELD

The present disclosure relates to a transparent conductor, a light control body, and an electronic device.

BACKGROUND ART

Transparent conductors are used for various applications by use of their characteristics. For example, a light control body comprising a transparent conductor can adjust the transmittance of light by controlling the orientation of liquid crystal molecules (see, e.g., Patent Literature 1). It is contemplated that light control bodies are utilized in buildings, automobile window panes, and the like. As such light control bodies, there are known an SPD system and a PDLC system that modulate transmitted light by accumulating electric charges in transparent conductors disposed opposite with a light control layer therebetween to generate an electric field.

As transparent conductors for light control bodies, ones having an ITO electrode are known, as listed in Patent Literature 1. Meanwhile, there is known a transparent conductor having a laminate structure laminated so as to sandwich a metal layer containing silver between a pair of metal oxide layers (see, e.g., Patent Literature 2).

CITATION LIST

Patent Literature

Patent Literature 1: International Publication No.
Patent Literature 2: Japanese Unexamined Patent Publication No. 2002-157929

SUMMARY OF INVENTION

Technical Problem

Since a transparent conductor having a metal layer containing silver is excellent in heat-shielding performance, energy saving is expected to be achieved by using such a transparent conductor in a light control body. However, when a conventional transparent conductor having a metal layer containing silver is used in an electronic device, a leakage current may become large depending on the use state. When the leakage current locally becomes large, power consumption becomes larger, and additionally, it is feared that ion migration may occur in the metal layer. This ion migration significantly occurs in a metal layer containing silver, in particular.

In such circumstances, an object of the present disclosure is, in one aspect, to provide a transparent conductor that enables prevention of occurrence of a local leakage current. An object of the present disclosure is, in another aspect, to provide a light control body that comprises a transparent conductor enabling prevention of occurrence of a local leakage current. An object of the present disclosure is, in still another aspect, to provide an electronic device that comprises a light control body enabling prevention of occurrence of a local leakage current.

Solution to Problem

The present disclosure provides, in one aspect, a transparent conductor comprising a transparent substrate, a first dielectric layer, a metal layer containing silver or a silver alloy as a primary component, a second dielectric layer composed of a semiconductor, and a third dielectric layer of which electrical conductivity is different from that of the second dielectric layer, in the order presented, wherein the third dielectric layer is composed of an insulator or a conductor.

When a voltage is applied in the lamination direction of the above transparent conductor, an electric charge is generated in the metal layer. Such a transparent conductor has a structure in which a plurality of layers different in material from one another is laminated, and thus it is usually difficult to maintain the uniformity of the resistance value in the lamination direction. When the transparent conductor comprises a semiconductor, it is also usually difficult to form a semiconductor excellent in the uniformity of the in-plane resistance value. For this reason, when a large voltage is applied on a transparent conductor including a dielectric layer composed of a semiconductor and comprising a plurality of layers different in material from one another, it is feared that the second dielectric layer composed of a semiconductor becomes locally conductive at a point where electricity is likely to flow to thereby generate a leakage current. Then, when the transparent conductor comprises a third dielectric layer composed of an insulator, it is possible to prevent the second dielectric layer from becoming conductive. This enables prevention of occurrence of a local leakage current. Additionally, the leakage current is entirely reduced to thereby also enable power consumption to be reduced.

When the transparent conductor comprises a third dielectric layer composed of a conductor, electrons that are conductive through the second dielectric layer are dispersed to thereby enable prevention of occurrence of a local leakage current. Thus, the third dielectric layer, by virtue of being composed of an insulator or a conductor, can serve as a resistance adjusting layer for the second dielectric layer.

In some embodiments, the second dielectric layer may be composed of a semiconductor including a metal oxide containing one or both of Zn and Sn as constituent elements, and the third dielectric layer may be composed of a conductor including a metal oxide containing In as a constituent element. Such a transparent conductor can, by virtue of comprising the third dielectric layer excellent in conductivity, further prevent occurrence of a local leakage current. Additionally, the transparent conductor is, by virtue of comprising the second dielectric layer composed of a semiconductor including a metal oxide containing one or both of Zn and Sn as constituent elements, also excellent in transparency and storage stability.

In other some embodiments, the second dielectric layer may be composed of the semiconductor including a metal oxide containing one or both of Zn and Sn as constituent elements, and the third dielectric layer may be composed of an insulator containing one or both of a nitride of Si and an oxide of Si.

Such a transparent conductor can, by virtue of comprising the third dielectric layer excellent in conductivity, further prevent occurrence of a local leakage current. Additionally, the transparent conductor is, by virtue of comprising the second dielectric layer composed of a semiconductor including a metal oxide containing one or both of Zn and Sn as constituent elements, also excellent in transparency and storage stability.

The third dielectric layer of the transparent conductor may be composed of a conductor, and a fourth dielectric layer composed of an insulator containing one or both of a nitride of Si and an oxide of Si may be further included on the side opposite to the second dielectric layer side of the third dielectric layer. Such a transparent conductor can sufficiently prevent occurrence of a local leakage current as well as can reduce power consumption.

The present disclosure provides, in another aspect, a light control body comprising a pair of transparent conductors and a light control layer therebetween, wherein at least one of the pair of transparent conductors is any of the transparent conductors mentioned above. This light control body can, by virtue of comprising any of the transparent conductors mentioned above, prevent occurrence of a local leakage current.

The present disclosure provides, in still another aspect, an electronic device comprising the light control body and a power source. This electronic device can, by virtue of comprising the light control body comprising any of the transparent conductors mentioned above, prevent occurrence of a local leakage current.

Advantageous Effects of Invention

In one aspect, a transparent conductor that can prevent occurrence of a local leakage current can be provided. In another aspect, a light control body comprising a transparent conductor that can prevent occurrence of a local leakage current can be provided. In still another aspect, an electronic device comprising a light control body that can prevent occurrence of a local leakage current can be provided.

DESCRIPTION OF EMBODIMENTS

Hereinbelow, embodiments of the present invention will be described optionally with reference to the drawings. However, the embodiments below are examples to describe the present invention, and are not intended to limit the present invention to the contents below. In the descriptions, an identical reference sign is used for identical structures or components having identical function, and redundant descriptions are occasionally omitted. The positional relation such as up and down/left and right in a drawing is as illustrated in the drawing, unless otherwise specified. Further, the dimensional ratio of the drawings is not limited to that illustrated.

Figure 1:
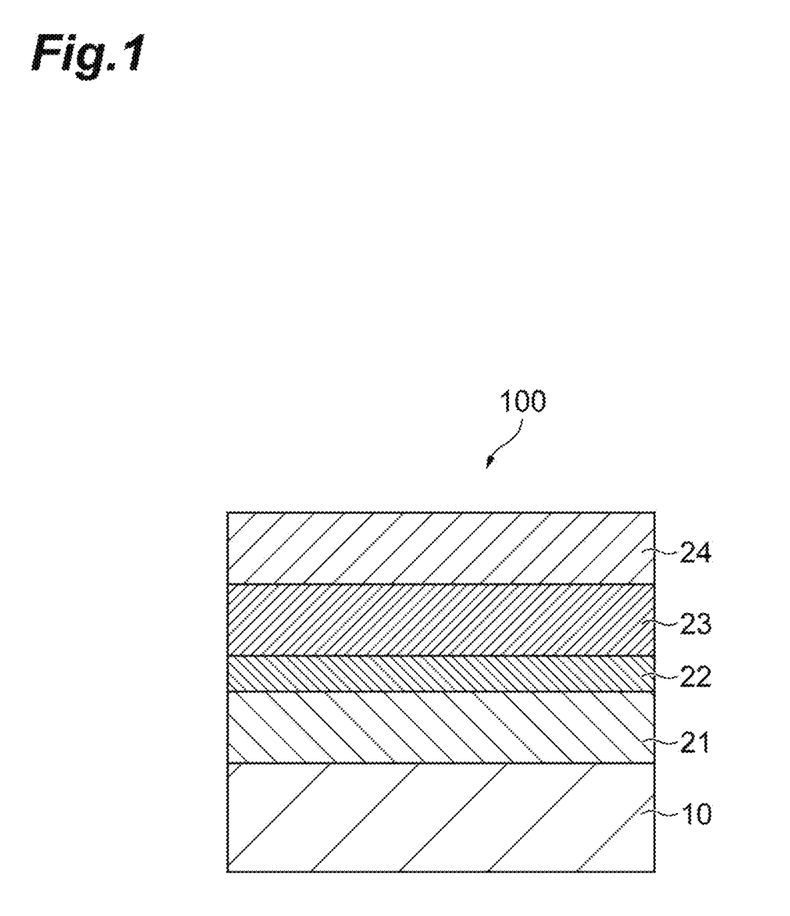
FIG. 1 is a schematic cross-sectional view of a transparent conductor according to one embodiment.

FIG. 1 is a schematic cross-sectional view of a transparent conductor according to the present embodiment. A transparent conductor 100 in FIG. 1 comprises a transparent substrate 10, a dielectric layer 21 (first dielectric layer), a metal layer 22 containing silver or a silver alloy as the primary component, a dielectric layer 23 (second dielectric layer) composed of a semiconductor, and a dielectric layer 24 (third dielectric layer) composed of a conductor in the order presented.

The transparent substrate 10 may be an organic resin film having flexibility. The organic resin film may be an organic resin sheet. Examples of the organic resin film include polyester films such as polyethylene terephthalate (PET) films and polyethylene naphthalate (PEN) films; polyolefin films such as polyethylene films and polypropylene films; polycarbonate films; acrylic films; norbornene films; polyarylate films; polyether sulfone films; diacetylcellulose films; and triacetylcellulose films. Among them, polyester films such as polyethylene terephthalate (PET) films and polyethylene naphthalate (PEN) films are preferred. One of those mentioned above may be used singly or two or more of these may be used in combination.

The transparent substrate 10 is preferably thicker in view of rigidity. In contrast, the transparent substrate 10 is preferably thinner in view of making the transparent conductor 100 thinner. In such a view, the thickness of the transparent substrate 10 is from 10 to 200 μm, for example.

The transparent substrate 10 is not limited to one made of an organic resin and may be a molded article of an inorganic compound, for example, soda lime glass, non-alkali glass, and quartz glass.

The term "transparent" in the present disclosure means that visible light is transmitted, and a certain degree of light scattering is permitted. What is called "semitransparent", which allows light scattering, is also included in the concept of "transparent" in the present disclosure. The visible light transmittance of the transparent substrate 10 in the wavelength range of 450 to 650 nm is, for example, 80% or more and preferably 90% or more.

The dielectric layer 21 may be composed of a semiconductor or may be composed of an insulator. The dielectric layer 21 is preferably composed of a semiconductor to sufficiently prevent electromigration in the metal layer 22. Specifically, the dielectric layer 21 may be a layer containing a metal oxide or may be a metal oxide layer composed of a metal oxide.

The dielectric layer 21 may contain, for example, four components: zinc oxide, tin oxide, indium oxide, and titanium oxide or three components: zinc oxide, indium oxide, and titanium oxide, as primary components. The dielectric layer 21, when containing the four components, can be the dielectric layer 21 that combines sufficiently high electrical conductivity and transparency. The zinc oxide is, for example, ZnO, and the indium oxide is, for example, $In_2O_3$. The titanium oxide is, for example, $TiO_2$, and the tin oxide is, for example, $SnO_2$. The ratio of metal atoms to oxygen atoms in each metal oxide may be deviated from the stoichiometric ratio.

The "primary component" in the present disclosure means that the ratio with respect to the total is 80% by mass or more. The resistance of the dielectric layer 21 may be higher than that of the dielectric layer 23. Accordingly, the tin oxide content of the dielectric layer 21 may be lower than that of the dielectric layer 23, or may not contain tin oxide.

In the case where the dielectric layer 21 contains three components: zinc oxide, indium oxide, and titanium oxide, when the three components each were converted to ZnO, $In_2O_3$, and $TiO_2$, the content of ZnO based on the total of the three components is preferably the highest of the three components. The content of ZnO based on the total of the three components is, for example, 45 mol % or more to reduce the light absorptivity of the dielectric layer 21. In the dielectric layer 21, the content of ZnO based on the total of the three components is, for example, 85 mol % or less to sufficiently enhance the storage stability under a high-temperature and high-humidity environment.

In the dielectric layer 21, the content of $In_2O_3$ based on the total of the three components is, for example, 35 mol % or less to reduce the light absorptivity of the dielectric layer 21. In the dielectric layer 21, the content of $In_2O_3$ based on the total of the three components, is for example, 10 mol % or more to sufficiently enhance the storage stability under a high-temperature and high-humidity environment.

In the dielectric layer 21, the content of $TiO_2$ based on the total of the three components is, for example, 20 mol % or less to reduce the light absorptivity of the dielectric layer 21. In the dielectric layer 21, the content of $TiO_2$ based on the total of the three components, is for example, 5 mol % or more to sufficiently enhance the storage stability under a high-temperature and high-humidity environment. The content of each of the three components is a value determined by converting zinc oxide, indium oxide, and titanium oxide to ZnO, $In_2O_3$, and $TiO_2$, respectively.

The dielectric layer 23 is composed of a semiconductor. Specifically, the dielectric layer 21 may be a layer containing a metal oxide or may be a metal oxide layer composed of a metal oxide.

The dielectric layer 23 may contain, for example, four components: zinc oxide, indium oxide, titanium oxide, and tin oxide or three components: zinc oxide, titanium oxide, and tin oxide, as primary components. The dielectric layer 23, when containing the four components or three components as the primary components, can combine electrical conductivity and high transparency. The zinc oxide is, for example, ZnO, and the indium oxide is, for example, $In_2O_3$. The titanium oxide is, for example, $TiO_2$, and the tin oxide is, for example, $SnO_2$. The ratio of metal atoms to oxygen atoms in each metal oxide may be deviated from the stoichiometric ratio.

In the dielectric layer 23, the content of zinc oxide based on the total of the four components, is for example, 20 mol % or more to maintain the high transparency as well as to sufficiently enhance the electrical conductivity. In the dielectric layer 23, the content of zinc oxide based on the total of the four components is, for example, 68 mol % or less to sufficiently enhance the storage stability under a high-temperature and high-humidity environment.

In the dielectric layer 23, the content of indium oxide based on the total of the four components is, for example, 35 mol % or less to make the surface resistance sufficiently low as well as to bring the transmittance within an appropriate range. In the dielectric layer 23, the content of indium oxide based on the total of the four components is, for example, 15 mol % or more to sufficiently enhance the storage stability under a high-temperature and high-humidity environment.

In the dielectric layer 23, the content of titanium oxide based on the total of the four components is, for example, 20 mol % or less to obtain visible light transmittance. In the dielectric layer 23, the content of titanium oxide based on the total of the four components is, for example, 5 mol % or more to sufficiently enhance the alkali resistance.

In the dielectric layer 23, the content of tin oxide based on the total of the four components is, for example, 40 mol % or less to obtain high transparency. In the dielectric layer 23, the content of tin oxide based on the total of the four components is, for example, 5 mol % or more to sufficiently enhance the storage stability under a high-temperature and high-humidity environment. The content of each of the four components is a value determined by converting zinc oxide, indium oxide, titanium oxide, and tin oxide to ZnO, $In_2O_3$, $TiO_2$, and $SnO_2$, respectively.

In the dielectric layer 23, the content of zinc oxide based on the total of the three components, is for example, 20 mol % or more to maintain the high transparency as well as to sufficiently enhance the electrical conductivity. In the dielectric layer 23, the content of zinc oxide based on the total of the four components is, for example, 80 mol % or less to sufficiently enhance the storage stability under a high-temperature and high-humidity environment.

In the dielectric layer 23, the content of titanium oxide based on the total of the three components is, for example, 40 mol % or less to obtain visible light transmittance. In the dielectric layer 23, the content of titanium oxide based on the total of the three components is, for example, 5 mol % or more to sufficiently enhance the alkali resistance.

In the dielectric layer 23, the content of tin oxide based on the total of the three components is, for example, 40 mol % or less to obtain high transparency. In the dielectric layer 23, the content of tin oxide based on the total of the three components is, for example, 5 mol % or more to sufficiently enhance the storage stability under a high-temperature and high-humidity environment. The content of each of the three components is a value determined by converting zinc oxide, titanium oxide, and tin oxide to ZnO, $TiO_2$, and $SnO_2$, respectively.

The dielectric layer 21 and the dielectric layer 23 combine functions such as adjustment of optical properties, protection of the metal layer 22, and obtainment of electrical conductivity. The dielectric layer 21 and the dielectric layer 23 may contain a trace component or an inevitable component in addition to the components mentioned above to the extent that the functions thereof are not significantly compromised. However, to allow the transparent conductor 100 to have sufficiently high properties, the proportion of the total of the three components or of the four components in the dielectric layer and 21 and the dielectric layer 23 is preferably higher. Both the proportions are, for example, 95% by mass or more and preferably 97% by mass or more. The dielectric layer 21 may be a layer consisting of the three components. The dielectric layer 23 may be a layer consisting of the four components or the three components.

The composition of the dielectric layer 21 may be the same as or different from the composition of the dielectric layer 23. When the compositions of the dielectric layer 21 and of the dielectric layer 23 are identical, it is possible to simplify the production process. For example, the dielectric layer 21 may be a layer containing four components: zinc oxide, indium oxide, titanium oxide, and tin oxide as primary components, similarly as the dielectric layer 23. In this case, the specific example of the proportion of each metal oxide based on the total of the four components in the dielectric layer 21 may be the same as in the dielectric layer 23. Accordingly, the content concerning the numerical range of each component in the dielectric layer 23 can be applied to the dielectric layer 21.

The dielectric layer 23 is a layer containing the four components as primary components, whereas the dielectric layer 21 may be a layer containing three components: zinc oxide, indium oxide, and titanium oxide as primary components. This enables the transparency to be kept high and the production cost to be reduced. In this case, the electrical conductivity of the dielectric layer 21 becomes lower than that of the dielectric layer 23, but there is no interference because the electrical conductivity can be obtained by the dielectric layer 23.

The thicknesses of the dielectric layer 21 and of the dielectric layer 23 are, for example, from 3 to 70 nm and preferably from 5 to 50 nm to achieve both of high transparency and electrical conductivity at a high level. The thicknesses of the dielectric layer 21 and of the dielectric layer 23 may be the same or different from each other. For example, by individually adjusting the thicknesses of the dielectric layer 21 and thickness of the dielectric layer 23, it is possible to suppress changes in the transmissive color tone or to effectively utilize an optical interference effect for converting reflected light to be generated in the metal layer 22 into transmitted light.

The dielectric layer 21 and the dielectric layer 23 can be fabricated by using a vacuum film formation method such as a vacuum deposition method, a sputtering method, an ion plating method, and a CVD method. Among them, the sputtering method is preferable because a smaller film-forming chamber can be used and the film-forming speed is high. Examples of the sputtering method include DC magnetron sputtering. For the target, an oxide target or a metal or semi-metal target can be used.

The metal layer 22 contains silver or a silver alloy as the primary component. The total content of silver and a silver alloy in the metal layer 22 may be, for example, 90% by mass or more or may be 95% by mass or more in terms of silver element. The metal layer 22 may contain metal elements other than silver. For example, containing at least one element selected from the group consisting of Cu, Nd, Pt, Pd, Bi, Sn, and Sb as a constituent element of the silver alloy or a single metal can improve the environment resistance of the metal layer 22. Examples of the silver alloy include Ag—Pd, Ag—Cu, Ag—Pd—Cu, Ag—Nd—Cu, Ag—In—Sn, and Ag—Sn—Sb.

The thickness of the metal layer 22 is, for example, from 1 to 15 nm, preferably from 5 to 12.5 nm, and more preferably from 7.5 to 12.5 nm to sufficiently lower the infrared transmittance as well as to bring the visible light transmittance within an appropriate range.

The metal layer 22 can be formed with, for example, DC magnetron sputtering. The film forming method for the metal layer 22 is not particularly limited, and another vacuum film formation method using plasma or ion beams, a coating method using a liquid of constituents dispersed in an appropriate binder, or the like may be appropriately selected.

The dielectric layer 24 is a layer of which electrical conductivity is different from that of the dielectric layer 23, being composed of an insulator. In the present disclosure, the "insulator", "conductor", and "semiconductor" constituting each layer are different in electrical conductivity from one another. In the present disclosure, a material of which surface resistance is $1 \times 10^8$ Ω/sq. or more corresponds to the "insulator". A material of which surface resistance is from $1 \times 10^4$ to $1 \times 10^7$ Ω/sq. corresponds to the "semiconductor". A material of which surface resistance is $1 \times 10^3$ Ω/sq. or less corresponds to the "conductor".

The dielectric layer 24 may be composed of, for example, an insulator containing one or both of a nitride of Si and an oxide of Si. The nitride of Si is silicon nitride and is represented by $Si_3N_4$, for example. The oxide of Si is silicon oxide and is represented by SiO or $SiO_2$, for example. The ratio between silicon atoms, nitrogen atoms, and oxygen atoms in the silicon nitride and silicon oxide may be deviated from the stoichiometric ratio. When the dielectric layer 24 contains both a nitride of Si and an oxide of Si, silicon oxynitride may be contained, or silicon nitride or silicon oxide may be separately contained.

The thickness of the dielectric layer 24 is, for example, from 1 to 50 nm, preferably from 2 to 40 nm, and more preferably from 3 to 30 nm to sufficiently reduce a leakage current as well as to obtain sufficient transparency. In the similar view, the total thickness of the dielectric layer 23 and the dielectric layer 24 may be, for example, from 4 to 120 nm and may be from 5 to 90 nm.

The dielectric layer 24 can be fabricated by using a vacuum film formation method such as a vacuum deposition method, a sputtering method, an ion plating method, and a CVD method. Among them, the sputtering method is preferable because a smaller film-forming chamber can be used and the film-forming speed is high. Examples of the sputtering method include DC magnetron sputtering. Sputtering may be performed using a silicon target as the target under an atmosphere of nitrogen gas, oxygen gas, or a mixed gas of nitrogen and oxygen.

The transparent conductor 100 in FIG. 1 comprises the transparent substrate 10, the dielectric layer 21, the metal layer 22 containing silver or a silver alloy as the primary component, the dielectric layer 23 composed of a semiconductor, and the dielectric layer 24 composed of an insulator in the order presented. The dielectric layer 24, as composed of an insulator, can reduce a leakage current leaking from the metal layer 22 into the dielectric layer 23. This can reduce power consumption when the transparent conductor 100 is used to form a light control body and an electronic device. Since occurrence of a local leakage current also can be prevented, occurrence of electromigration in the metal layer 22 can be prevented.

Figure 2:
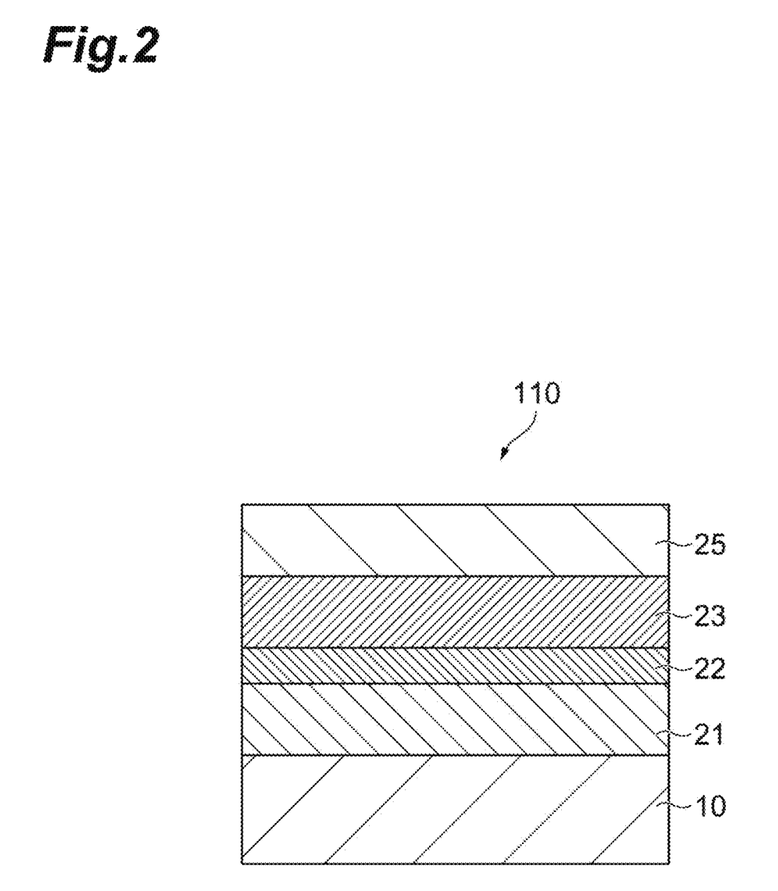
FIG. 2 is a schematic cross-sectional view of a transparent conductor according to another embodiment.

FIG. 2 is a schematic cross-sectional view of a transparent conductor 110 according to another embodiment. The transparent conductor 110 comprises a transparent substrate 10, a dielectric layer 21 (first dielectric layer), a metal layer 22 containing silver or a silver alloy as the primary component, a dielectric layer 23 (second dielectric layer) composed of a semiconductor, and a dielectric layer 25 (third dielectric layer) composed of a conductor in the order presented. That is, the transparent conductor 110 differs from the transparent conductor 100 in FIG. 1 in that the transparent conductor 110 comprises the dielectric layer 25 composed of a conductor on the dielectric layer 23. The composition, thickness, function, and the like of each layer of the transparent conductor 110 except for the dielectric layer 25 may be the same as those of the transparent conductor 100. Accordingly, the description content of the transparent conductor 100 of FIG. 1 can be applied to each layer of the transparent conductor 110.

The dielectric layer 25 is a layer of which electrical conductivity is different from that of the dielectric layer 23, being composed of a conductor. The dielectric layer 25 may be composed of, for example, a metal oxide. The metal oxide may be one containing In as a constituent element or may be one containing In and Sn as constituent elements. The metal oxide is, for example, indium tin oxide (ITO).

The thickness of the dielectric layer 25 is for example, from 1 to 50 nm, preferably from 3 to 40 nm, and more preferably from 5 to 30 nm to sufficiently reduce a local leakage current as well as to obtain sufficient transparency.

The dielectric layer 25 can be fabricated by using a vacuum film formation method such as a vacuum deposition method, a sputtering method, an ion plating method, and a CVD method. Among them, the sputtering method is preferable because a smaller film-forming chamber can be used and the film-forming speed is high. Examples of the sputtering method include DC magnetron sputtering. For the target, an oxide target or a metal or semi-metal target can be used.

The transparent conductor 110 comprises the transparent substrate 10, the dielectric layer 21, the metal layer 22 containing silver or a silver alloy as the primary component, the dielectric layer 23 composed of a semiconductor, and the dielectric layer 25 composed of a conductor in the order presented. Since the dielectric layer 24 is composed of a conductor, it can disperse a leakage current from the metal layer 22. This enables prevention of occurrence of a local leakage current. Accordingly, occurrence of electromigration in the metal layer 22 can be prevented.

Figure 3:
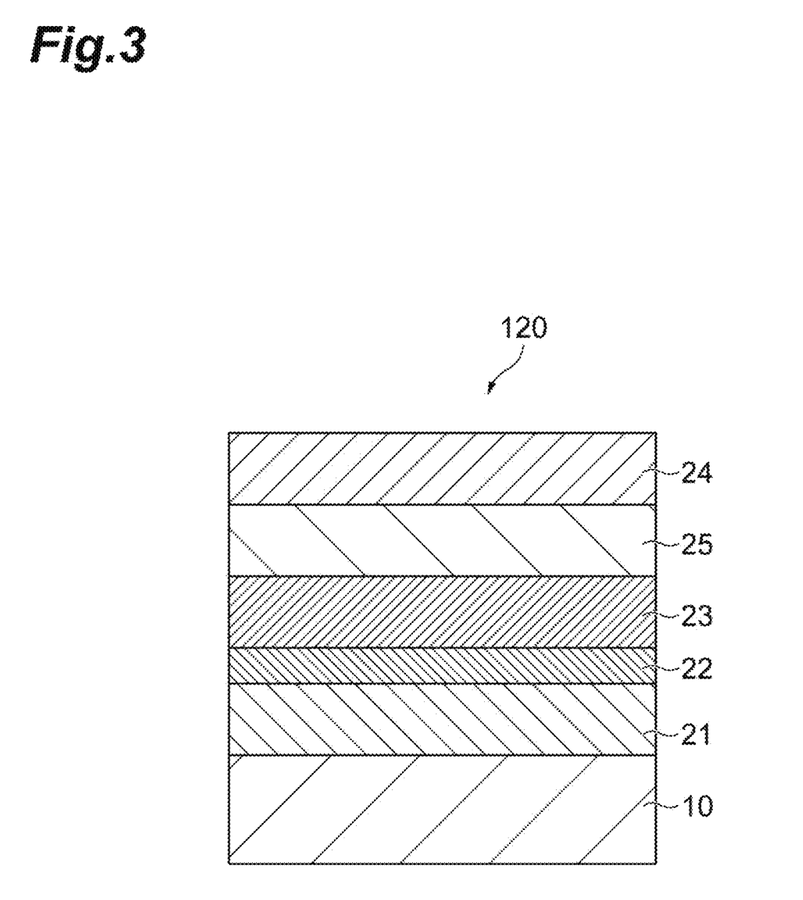
FIG. 3 is a schematic cross-sectional view of a transparent conductor according to still another embodiment.

FIG. 3 is a schematic cross-sectional view of a transparent conductor 120 according to still another embodiment. The transparent conductor 120 comprises a transparent substrate 10, a dielectric layer 21 (first dielectric layer), a metal layer 22 containing silver or a silver alloy as the primary component, a dielectric layer 23 (second dielectric layer) composed of a semiconductor, a dielectric layer 25 (third dielectric layer) composed of a conductor, and a dielectric layer 24 (fourth dielectric layer) composed of an insulator in the order presented. That is, the transparent conductor 120 differs from the transparent conductor 100 in FIG. 1 in that the transparent conductor 120 further comprises the dielectric layer 25 between the dielectric layer 23 and the dielectric layer 24. The composition, thickness, function, and the like of each of the dielectric layer 21, the metal layer 22, the dielectric layer 23, and the dielectric layer 24 may be the same as those of the transparent conductor 100. The composition, thickness, function, and the like of the dielectric layer 25 may be the same as those of the transparent conductor 110. Accordingly, the description content of the transparent conductor 100 and the transparent conductor 110 can be applied to the layers common to the transparent conductor 100 and the transparent conductor 110 among the layers of the transparent conductor 120.

The transparent conductor 120, by virtue of comprising the dielectric layer 25 composed of a conductor on the dielectric layer 23, can disperse a leakage current from the metal layer 22. The transparent conductor 120, by virtue of comprising the dielectric layer 24 composed of an insulator on the dielectric layer 25, can reduce a leakage current from the metal layer 22. Accordingly, both of prevention of electromigration in the metal layer 22 and reduction in power consumption can be achieved at a high level.

The transparent conductor in the present disclosure is not limited to those in FIG. 1 to FIG. 3. For example, the transparent conductors 100, 110, and 120 may each comprise any other layers. For example, a hard coat layer containing a resin cured product may be included between the transparent substrate 10 and the dielectric layer 21 and/or on the side opposite to the dielectric layer 21 side of the transparent substrate 10. This allows the hardness and strength of the transparent conductor to be improved. Any layers may not limited to this.

The visible light transmittance of the transparent conductors 100, 110, and 120 may be, for example, from 20 to 80%. The visible light reflectance of the transparent conductors 100, 110, and 120 may be, for example, from 5 to 20%. The infrared reflectance of the transparent conductors 100, 110, and 120 may be, for example, from 40% to 60%. This allows the heat-shielding property to be improved as well as occurrence of heat cracking to be sufficiently prevented. The infrared reflectance of the transparent conductors 100, 110, and 120 may be, for example, 60% or less in view of ease of production. The infrared transmittance of the transparent conductors 100, 110, and 120 may be, for example, from 5 to 35%.

The transmittance and the reflectance of visible light in the present disclosure each are the average value of measurements in the wavelength range of 450 to 650 nm. The infrared transmittance and the reflectance of infrared each are the average value of measurements in the wavelength range of 700 to 1200 nm. The transmittance and the reflectance of visible light and the transmittance and the reflectance of infrared each can be determined as the average value resulting from measurement using a commercially available measurement apparatus at a 10 nm pitch.

Figure 4:
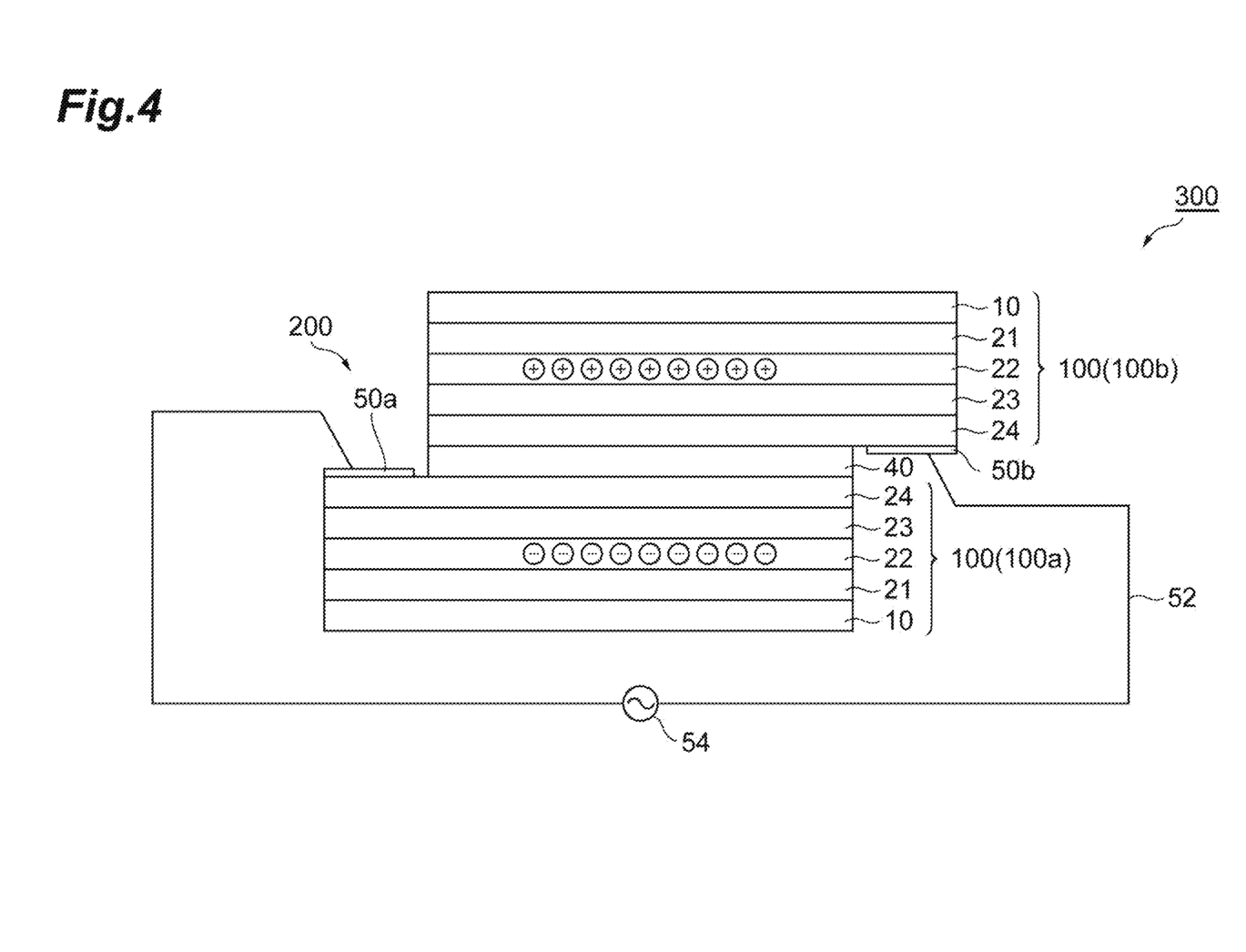
FIG. 4 is a schematic cross-sectional view of a light control body according to one embodiment and an electronic device comprising the same.

FIG. 4 is a schematic view of a light control body 200 and an electronic device 300 according to one embodiment. The light control body 200 of FIG. 4 comprises a pair of transparent conductors 100a and 100b and a light control layer 40 therebetween. The pair of transparent conductors 100a and 100b is laminated such that the dielectric layers 24 each are laminated on the light control layer 40 side. The pair of transparent conductors 100a and 100b is laminated in a shifted manner such that a portion of the surface of each dielectric layer 24 is exposed. In the present embodiment, the transparent conductor 100 is used in light control body applications.

Examples of the light control layer 40 include light control layers of an electrochromic system, an SPD (suspended particle device) system, and a PDLC (polymer dispersed liquid crystal, or also referred to as polymer dispersion liquid crystal). A PDLC becomes clouded when no voltage is applied thereon because of having a refractive index higher than that of air. That is, light is scattered on the surface thereof and visually recognized as an opaque white color. On the other hand, a PDLC becomes transparent when a voltage is applied thereon because the refractive index becomes substantially equivalent to that of air and thus light is not scattered on the surface thereof. Thus, the visible light transmittance can be adjusted. The light control layer 40 includes, for example, a matrix formed of a polymer and liquid crystals dispersed in the matrix.

The liquid crystals included in the light control layer 40 is not particularly limited, and examples thereof include nematic, smectic, and cholesteric liquid crystals. Meanwhile, the polymer included in the light control layer 40 is not particularly limited, and examples thereof include acrylic resins, vinyl ether-based resins, and ene-thiol-based resins. The content of the liquid crystals in the light control layer 40 is for example, from 20 to 70% by mass. The light control layer 40 can be formed by curing a resin composition containing liquid crystals. The resin composition contains, for example, an oligomer (prepolymer), a polyfunctional or monofunctional acrylic monomer, a vinyl ether-based monomer, and a liquid crystal compound. The resin composition may contain a photo-curing initiator and a dye.

Examples of the prepolymer include thiol-based prepolymers having a thiol group. Examples of the acrylic monomer include hydroxyethyl acrylate (HEA), hydroxyethyl methacrylate (HEMA), 1,6-hexanediol diacrylate (HDDA), tripropylene glycol diacrylate (TPGDA), and trimethylolpropane triacrylate (TMPTA). Examples of the vinyl ether-based monomer include butandiol monovinyl ether, 1,4-cyclohexanedimethanol monovinyl ether, and triethylene glycol divinyl ether.

Examples of the photo-curing initiator include free-radical-based ones. Examples thereof include diphenyl(2,4,6-trimethylbenzoyl)-phosphine oxide, phenyl bis(2,4,6-trimethylbenzoyl)-phosphine oxide, bis($\eta$5-2,4- cyclopentanedien-1-yl)bis[2,6-difluoro-3-(1H-pyrrol-1-yl)
phenyl]titanium, 1-hydroxycyclohexyl phenyl ketone, and
α,α-dimethoxy-α'-hydroxyacetophenone. The thickness of
the light control layer 40 is, for example, from 1 to 100 µm.

In production of the light control body 200, a dielectric layer 21, a metal layer 22, a dielectric layer 23, and a dielectric layer 23 are sequentially formed on one surface of the transparent substrate 10 to obtain the pair of transparent conductors 100a and 100b. The pair of transparent conductors 100a and 100b is superposed on each other such that the dielectric layers 23 are faced to each other with a resin composition containing liquid crystals therebetween. Then, the resin composition is cured by light irradiation or heating to thereby bind the pair of transparent conductors 100a and 100b to each other via the light control layer 40.

The pair of transparent conductors 100 each comprises the dielectric layer 24, the dielectric layer 23, the metal layer 22, the dielectric layer 21, and the transparent substrate 10 from the light control layer 40 side. The light control body 200 comprises a transparent conductor 100 that can prevent occurrence of a local leakage current. Accordingly, occurrence of electromigration in each of the metal layers 22 can be prevented.

The thickness of the light control body 200 and the transparent substrate and layers of the transparent conductors 100 constituting the light control body 200 can be measured by using the following procedure. The light control body 200 or the transparent conductors 100 are cut with a focused ion beam (FIB) apparatus to obtain a cross-section. The cross-section is observed under a transmission electron microscope (TEM) to measure the thickness of each layer. It is preferable to measure at 10 or more positions arbitrarily selected to determine the average value. A microtome, an apparatus other than focused ion beam apparatuses, may be used as a means to obtain a cross-section. A scanning electron microscope (SEM) may be used as means to measure the thickness. Alternatively, measurement of the film thickness can be performed by using an X-ray fluorescence analyzer.

A electronic device 300 comprises the light control body 200, an electrode 50a on the exposed surface of the dielectric layer 24 of the one transparent conductor 100a, an electrode 50b on the exposed surface of the dielectric layer 24 of the other transparent conductor 100b, and a lead 52 electrically connecting the electrode 50a and the electrode 50b via an alternating current power supply 54. The light control layer 40 is interposed between the electrode 50a and the electrode 50b. Thus, depending on a potential difference due to the alternating current power supply 54, positive electric charges or negative electric charges are generated in each of the pair of metal layers 22, as shown in FIG. 4. This generates an electric field to thereby change the orientation of the liquid crystal contained in the light control layer 40. As mentioned above, the light control body 200 performs light control.

The electronic device 300, by virtue of comprising the transparent conductors 100, can prevent occurrence of a local leakage current between the pair of transparent conductors 100. Accordingly, occurrence of electromigration in the light control body 200 can be prevented.

In the present embodiment, the light control body 200 and the electronic device 300 comprising the pair of transparent conductors 100 have been described, but the light control body of the present disclosure is not limited thereto. For example, at least one of the pair of transparent conductors 100 may be the transparent conductor 110, the transparent conductor 120, or a transparent conductor different from these. When at least one of the pair of transparent conductors 100 is the transparent conductor 110 or the transparent conductor 120, a leakage current between the pair of transparent conductor 100 is prevented as well as power consumption of the light control body and the electronic device can be reduced.

Although some embodiments have been described hereinabove, the present disclosure is not limited to the embodiments. The transparent conductor of the present disclosure may be used in applications other than light control bodies. The production method therefor may be a common sheet-type method, a roll-to-roll method, or the like. Any method provides the same effect.

EXAMPLES

The contents of the present invention will be described in more detail using Examples and Comparative Examples, but the present invention is not intended to be limited to these Examples.

Fabrication of Transparent Conductor

Example 1

A polyethylene terephthalate (PET) film having a thickness of 125 µm was prepared as a transparent substrate. A first dielectric layer composed of a semiconductor, a metal layer containing a silver alloy as the primary component, a second dielectric layer composed of a semiconductor, and a third dielectric layer composed of an insulator were formed in the order presented on one surface of the transparent substrate by DC magnetron sputtering. Thereby, provided was a transparent conductor having the transparent substrate, the first dielectric layer (thickness: 30 nm), the metal layer (thickness: 9 nm), the second dielectric layer (thickness: 27 nm), and the third dielectric layer (thickness: 3 nm) in the order presented.

The first dielectric layer was formed using a ZnO—In$_2$O$_3$—TiO$_2$ target, and the second dielectric layer was formed using a ZnO—In$_2$O$_3$—TiO$_2$—SnO$_2$ target. The composition of each of the targets (molar ratio) was as shown in Table 1. The first dielectric layer and the second dielectric layer each had the same composition as the target.

TABLE 1

|  | ZnO | In$_2$O$_3$ | TiO$_2$ | SnO$_2$ |
| --- | --- | --- | --- | --- |
| Second dielectric layer | 35 | 29 | 14 | 22 |
| First dielectric layer | 77 | 14 | 9 | 0 |

The metal layer was formed using an Ag—Pd—Cu target. The composition of the target was Ag:Pd:Cu=99.0:0.5:0.5 (% by mass). The metal layer had the same composition as the target.

The third dielectric layer was formed using a silicon target doped with boron under a mixed atmosphere of argon gas and nitrogen gas (Ar:N$_2$=80% by volume:20% by volume). The third dielectric layer was composed of an insulator containing a nitride of silicon.

Example 2

A transparent conductor was fabricated in the same manner as in Example 1, except that the thickness of the second dielectric layer was changed to 20 nm and the thickness of the third dielectric layer was changed to 7 nm.

Example 3

A transparent conductor was fabricated in the same manner as in Example 1, except that the thickness of the second dielectric layer was changed to 10 nm and the thickness of the third dielectric layer was changed to 20 nm.

Example 4

A transparent conductor was fabricated in the same manner as in Example 1, except that the thickness of the second dielectric layer was changed to 5 nm and the thickness of the third dielectric layer was changed to 25 nm.

Example 5

A transparent conductor was fabricated in the same manner as in Example 1, except that the thickness of the second dielectric layer was changed to 15 nm, the third dielectric layer was replaced by a dielectric layer composed of a conductor (ITO), and the thickness of the third dielectric layer was changed to 15 nm.

The third dielectric layer was formed in the following procedure. The third dielectric layer composed of ITO was formed on the second dielectric layer using an $In_2O_3$—$SnO_2$ target under a mixed atmosphere of argon gas and oxygen gas ($Ar:O_2$=98% by volume:2% by volume). The composition of the $In_2O_3$—$SnO_2$ target was $In_2O_3$—$SnO_2$=92:8 (% by mass). The conductive layer had a substantially same composition as the $In_2O_3$—$SnO_2$ target.

Example 6

A transparent conductor was fabricated in the same manner as in Example 5, except that the thickness of the second dielectric layer and the third dielectric layer was changed to 10 nm and a fourth dielectric layer having a thickness of 10 nm composed of an insulator was formed on the third dielectric layer. The fourth dielectric layer having a thickness of 10 nm was formed in the same procedure as for the third dielectric layer of Example 1. The fourth dielectric layer was formed of an insulator containing a nitride of silicon.

Comparative Example 1

A polyethylene terephthalate (PET) film having a thickness of 125 µm was prepared as a transparent substrate. A first dielectric layer composed of a conductive layer, a metal layer containing a silver alloy as the primary component, and a second dielectric layer composed of a conductive layer were formed in the order presented on one surface of the transparent substrate by DC magnetron sputtering. Thereby, provided was a transparent conductor having the transparent substrate, the first dielectric layer composed of a conductive layer (thickness: 30 nm), the metal layer (thickness: 9 nm), and the second dielectric layer composed of a conductor (thickness: 30 nm) in the order presented.

The first dielectric layer and the second dielectric layer were formed in the following procedure. That is, the first dielectric layer composed of ITO was formed on the transparent substrate using an $In_2O_3$—$SnO_2$ target under a mixed atmosphere of argon gas and oxygen gas ($Ar:O_2$=98% by volume:2% by volume). Then, the metal layer was formed on the first dielectric layer using the same Ag—Pd—Cu target as in Example 1. The metal layer had the same composition as the Ag—Pd—Cu target.

Subsequently, the second dielectric layer was formed on the metal layer in the same manner as for the first dielectric layer. The composition of the target used in the formation of the first dielectric layer and the second dielectric layer was $In_2O_3$—$SnO_2$=92:8 (% by mass). The conductor constituting the first dielectric layer and the second dielectric layer had a substantially same composition as the $In_2O_3$—$SnO_2$ target.

Comparative Example 2

A transparent conductor was fabricated in the same manner as in Example 1, except that the thickness of the second dielectric layer was changed to 30 nm and no third dielectric layer was formed.

The composition and the thickness of the second dielectric layer, the third dielectric layer, and the fourth dielectric layer of the transparent conductor fabricated in each of Examples and Comparative Examples are summarized in Table 2.

Fabrication of Light Control Body and Electronic Device

Two transparent conductors (length×width=200 mm×300 mm) were fabricated in each of Examples and Comparative Examples. Then, a light control body and an electronic device were fabricated as shown in FIG. 4. Specifically, 5 g of a low-molecular-weight nematic liquid crystal material (produced by Wako Pure Chemical Industries, Ltd., 5CB), 10 g of an UV-curable resin (produced by Norland Products Inc., product name: Norland Optical Adhesive 65), and 0.15 g of resin particles (produced by Negami Chemical Industrial Co., Ltd., product name: ART PEARL GR-600, average particle size: 10.5 µm) were mixed to prepare a light modulating solution.

By use of a syringe, 0.5 g of the light modulating solution was measured. This light modulating solution was applied on the third dielectric layer (a portion of the fourth dielectric layer in Example 6, the second dielectric layer in Comparative Examples 1 and 2) of one transparent conductor (the transparent conductor 100a in FIG. 4). Then, in Examples 1 to 5, the pair of transparent conductors was superposed on each other such that portions of the third dielectric layers of the transparent conductor and the other transparent conductor (the transparent conductor 100b in FIG. 4) were faced to each other with the light modulating solution therebetween. In Example 6, the pair of transparent conductors was superposed on each other such that the fourth dielectric layers were faced to each other with the light modulating solution therebetween. In Comparative Examples 1 and 2, the pair of transparent conductors were superposed on each other such that the second dielectric layers were faced to each other with the light modulating solution therebetween. In each of Examples and Comparative Examples, the pair of transparent conductors was superposed on each other in a shifted manner such that portions of the surface of the third dielectric layers were exposed as shown in FIG. 4.

The light modulating solution sandwiched between the pair of transparent conductors was extended and smoothed using a rubber roller. Thereafter, the light modulating solution was cured by ultraviolet irradiation using an UV irradiation apparatus to thereby form a light control layer (liquid crystal layer). The integrated quantity of light at this time was set to 800 mJ/cm$^2$. Electrodes were formed on the exposed portions of the faced surfaces of the light control bodies thus obtained, as shown in FIG. 4, and an alternating current power supply was connected to the electrodes via a lead.

Evaluation

A slidac produced by AS ONE Corporation (product name: RSA10) was used to conduct an energization test to apply the alternating current power supply to the light control bodies. The haze of the light control layer changed in accordance with the voltage applied. The voltage at which the haze reached 30% or less was measured as a required voltage. The haze was measured using a haze meter (product name: NDH5000) produced by NIPPON DENSHOKU INDUSTRIES CO., LTD. The results are as shown in Table 3.

Figure 5:
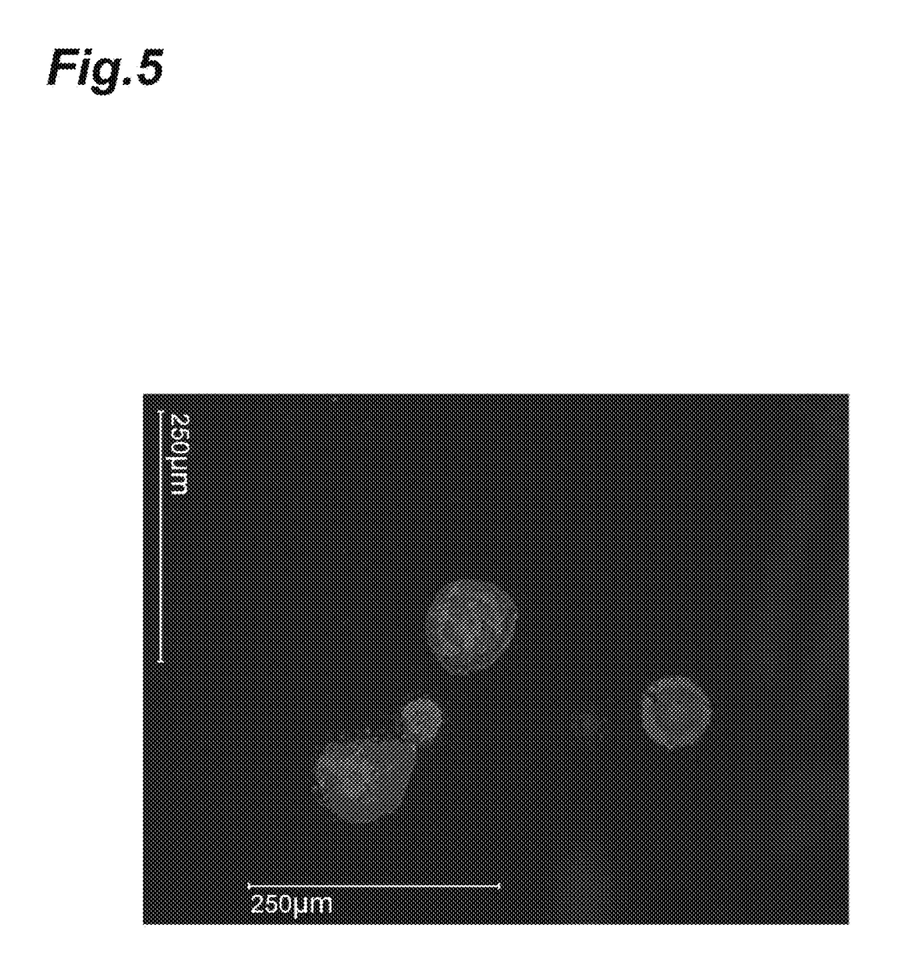
FIG. 5 is a photograph showing an image of a metal layer in the light control body after energization test in Comparative Example 2, observed with an optical microscope.
Figure 6:
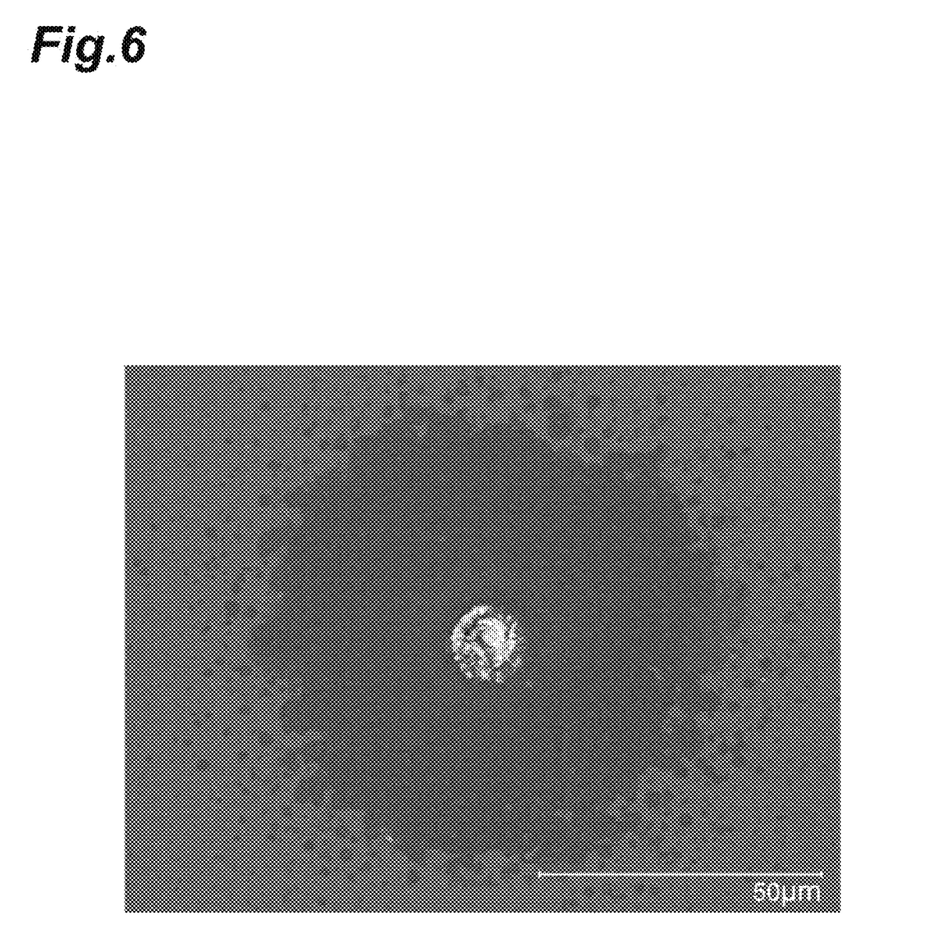
FIG. 6 is a photograph showing an image of defects shown in FIG. 5, observed with a scanning electron microscope.

Energization was continued for 24 hours under conditions of 60° C. and 100 V using the same apparatus as in the energization test described above. Thereafter, the metal layers in the light control bodies were observed using an optical microscope (magnification: 50 times) to evaluate whether point-like defects associated with electromigration were present or not. The results were as shown in Table 3.

showing an image of a metal layer after the energization test in Comparative Example 2, observed with an optical microscope. FIG. 6 is a photograph showing an image of defects shown in FIG. 5, observed with a scanning electron microscope. As shown in these photographs, point-like defects occurred in association with electromigration in Comparative Examples 1 and 2.

INDUSTRIAL APPLICABILITY

In one aspect, a transparent conductor that can prevent occurrence of a local leakage current is provided. In another aspect, a light control body comprising a transparent conductor that can prevent occurrence of a local leakage current is provided. In still another aspect, an electronic device comprising a light control body that can prevent occurrence of a local leakage current is provided.

REFERENCE SIGNS LIST

10: transparent substrate, 21: dielectric layer, 22: metal layer, 23: dielectric layer, 24: dielectric layer, 25: dielectric layer, 40: light control layer, 50a, 50b: electrode, 52: lead, 54: alternating current power supply, 100, 100a, 100b, 110, 120: transparent conductor, 200: light control body, 300: electronic device.

TABLE 2

| | First dielectric layer | | Second dielectric layer | | Third dielectric layer | | Fourth dielectric layer | |
|---|---|---|---|---|---|---|---|---|
| | Composition | Thickness | Composition | Thickness | Composition | Thickness | Composition | Thickness |
| Example 1 | ZnInTiO | 30 nm | SnZnInTiO | 27 nm | SiN | 3 nm | — | — |
| Example 2 | ZnInTiO | 30 nm | SnZnInTiO | 20 nm | SiN | 7 nm | — | — |
| Example 3 | ZnInTiO | 30 nm | SnZnInTiO | 10 nm | SiN | 20 nm | — | — |
| Example 4 | ZnInTiO | 30 nm | SnZnInTiO | 5 nm | SiN | 25 nm | — | — |
| Example 5 | ZnInTiO | 30 nm | SnZnInTiO | 15 nm | ITO | 15 nm | — | — |
| Example 6 | ZnInTiO | 30 nm | SnZnInTiO | 10 nm | ITO | 10 nm | SiN | 10 nm |
| Comparative Example 1 | ITO | 30 nm | ITO | 30 nm | — | — | — | — |
| Comparative Example 2 | ZnInTiO | 30 nm | SnZnInTiO | 30 nm | — | — | — | — |

TABLE 3

| | Energization test required voltage | Presence or absence of point-like defect |
|---|---|---|
| Example 1 | 25 V | Absence |
| Example 2 | 15 V | Absence |
| Example 3 | 15 V | Absence |
| Example 4 | 15 V | Absence |
| Example 5 | 40 V | Absence |
| Example 6 | 15 V | Absence |
| Comparative Example 1 | 50 V | Presence |
| Comparative Example 2 | 40 V | Presence |

As shown in Table 2 and Table 3, no point-like defect occurred in any of Examples 1 to 6 comprising the second dielectric layer composed of a semiconductor and the third dielectric layer composed of an insulator or a conductor. Accordingly, prevention of occurrence of a local leakage current was confirmed. Additionally, Examples 1 to 4 and Example 6, which comprise the third dielectric layer or the fourth dielectric layer composed of an insulator, enabled the required voltage to be lowered. That is, it was confirmed that the leakage current was lowered and power consumption was enabled to be reduced.

In Comparative Examples 1 and 2, point-like defects occurred after the energization test. FIG. 5 is a photograph

The invention claimed is:

1. A transparent conductor comprising:
   a transparent substrate,
   a first dielectric layer,
   a metal layer containing silver or a silver alloy as a primary component,
   a second dielectric layer composed of a semiconductor, and
   a third dielectric layer of which electrical conductivity is different from that of the second dielectric layer, in the order presented, wherein
   the third dielectric layer is composed of an insulator or a conductor.

2. The transparent conductor according to claim 1, wherein
   the second dielectric layer is composed of the semiconductor including a metal oxide containing one or both of Zn and Sn as constituent elements, and
   the third dielectric layer is composed of the conductor including a metal oxide containing In as a constituent element.

3. The transparent conductor according to claim 1, wherein
   the second dielectric layer is composed of the semiconductor including a metal oxide containing one or both of Zn and Sn as constituent elements, and the third dielectric layer is composed of the insulator containing one or both of a nitride of Si and an oxide of Si.

4. The transparent conductor according to claim 1, wherein
the third dielectric layer is composed of the conductor, and
a fourth dielectric layer composed of an insulator containing one or both of a nitride of Si and an oxide of Si is further included on the side opposite to the second dielectric layer side of the third dielectric layer.

5. A light control body comprising a pair of transparent conductors and a light control layer therebetween, wherein
at least one of the pair of transparent conductors is the transparent conductor according to claim 1.

6. An electronic device comprising a light control body according to claim 5 and a power supply.

7. The transparent conductor according to claim 2, wherein
the third dielectric layer is composed of the conductor, and
a fourth dielectric layer composed of an insulator containing one or both of a nitride of Si and an oxide of Si is further included on the side opposite to the second dielectric layer side of the third dielectric layer.

* * * * *